US 6,426,637 B1

(12) United States Patent
Dang et al.

(10) Patent No.: US 6,426,637 B1
(45) Date of Patent: Jul. 30, 2002

(54) ALIGNMENT GUIDE AND SIGNAL TRANSMISSION APPARATUS AND METHOD FOR SPRING CONTACT PROBE NEEDLES

(75) Inventors: Son N. Dang, Tempe; Gerald W. Back, Gilbert; H. Dan Higgins, Chandler; Scott R. Williams, Mesa, all of AZ (US)

(73) Assignee: Cerprobe Corporation, Gilbert, AZ (US)

( * ) Notice: Subject to any disclaimer, the term of this patent is extended or adjusted under 35 U.S.C. 154(b) by 0 days.

(21) Appl. No.: 09/469,944

(22) Filed: Dec. 21, 1999

(51) Int. Cl.[7] ............................................. G01R 31/02
(52) U.S. Cl. .................................................. 324/754
(58) Field of Search .............................. 324/765, 754, 324/757, 758, 760, 762, 761; 439/68, 482, 65, 66, 607, 608, 609

(56) References Cited

U.S. PATENT DOCUMENTS

| | | | |
|---|---|---|---|
| 3,613,001 A | 10/1971 | Hostetter | 324/158 P |
| 4,554,506 A | 11/1985 | Faure et al. | 324/158 P |
| 4,609,240 A | 9/1986 | Pistor | 339/17 LM |
| 4,636,722 A | 1/1987 | Ardezzone | 324/158 P |
| 4,791,363 A * | 12/1988 | Logan | 324/158 P |
| 4,806,109 A * | 2/1989 | Manabe et al. | 439/108 |
| 4,843,315 A | 6/1989 | Bayer et al. | 324/158 P |
| 5,037,311 A | 8/1991 | Frankeny et al. | 439/66 |
| 5,105,055 A * | 4/1992 | Mooney et al. | 174/27 |
| 5,151,653 A | 9/1992 | Yutori et al. | 324/158 P |
| 5,225,777 A | 7/1993 | Bross et al. | 324/158 P |
| 5,355,080 A | 10/1994 | Sato et al. | 324/761 |
| 5,416,429 A | 5/1995 | McQuade et al. | 324/762 |
| 5,497,104 A | 3/1996 | Balyasny | 324/755 |
| 5,521,518 A | 5/1996 | Higgins | 324/754 |
| 5,534,784 A | 7/1996 | Lum et al. | 324/757 |
| 5,565,788 A * | 10/1996 | Burr et al. | 324/762 |
| 5,589,781 A | 12/1996 | Higgins et al. | 324/755 |
| 5,602,490 A | 2/1997 | Blumenau | 324/754 |
| 5,613,861 A | 3/1997 | Smith et al. | 439/81 |
| 5,720,098 A | 2/1998 | Kister | 29/825 |
| 5,742,174 A | 4/1998 | Kister et al. | 324/762 |
| 5,764,072 A | 6/1998 | Kister | 324/754 |
| 5,850,148 A | 12/1998 | Nam | 324/761 |
| 5,884,395 A | 3/1999 | Dabrowiechi et al. | 29/825 |
| 5,888,075 A | 3/1999 | Hasegawa et al. | 439/73 |
| 5,923,178 A * | 7/1999 | Higgins | 324/754 |

* cited by examiner

*Primary Examiner*—N. Le
*Assistant Examiner*—Etienne P LeRoux
(74) *Attorney, Agent, or Firm*—Cahill, Sutton & Thomas P.L.C.

(57) ABSTRACT

Probe testing of an integrated circuit so as to achieve low probe needle contact resistance without probe needles "scrubbing" against bonding pads is achieved at high test signal frequencies by a probe needle assembly (14) including a plurality of probe needles (13) each having a shank portion (13A), a curved flex portion (13B), and a contact tip (13C) on a free end of the flex portion, the shank portion (13A) being electrically coupled to an electrical test system. The shank portion (13A) of each probe needle is attached to a surface (16A) of an insulative layer (16). The insulative layer is supported on a ground plane conductor 25. The flex portions (13B) of the probe needles (13) extend beyond an edge of the insulative layer. A portion (24) of the ground plane conductor (25) extends beyond the insulator (16) and is adjacent to all but an extending tip portion (30) of the flex portion (13B) of each probe needle (13). A thin insulator/guide layer (26B) is attached to the extending portion (24) of the ground plane conductor (25) and disposed between the extending portion and the flex portions (13B), the insulator/guide layer (26B) having a smooth, low friction surface to guide/stabilize the flex portions (13B) during flexing. The insulative layer (16) and insulator/guide layer (26B) provide matched impedance between the shank and flex portions of the probe needles.

40 Claims, 11 Drawing Sheets

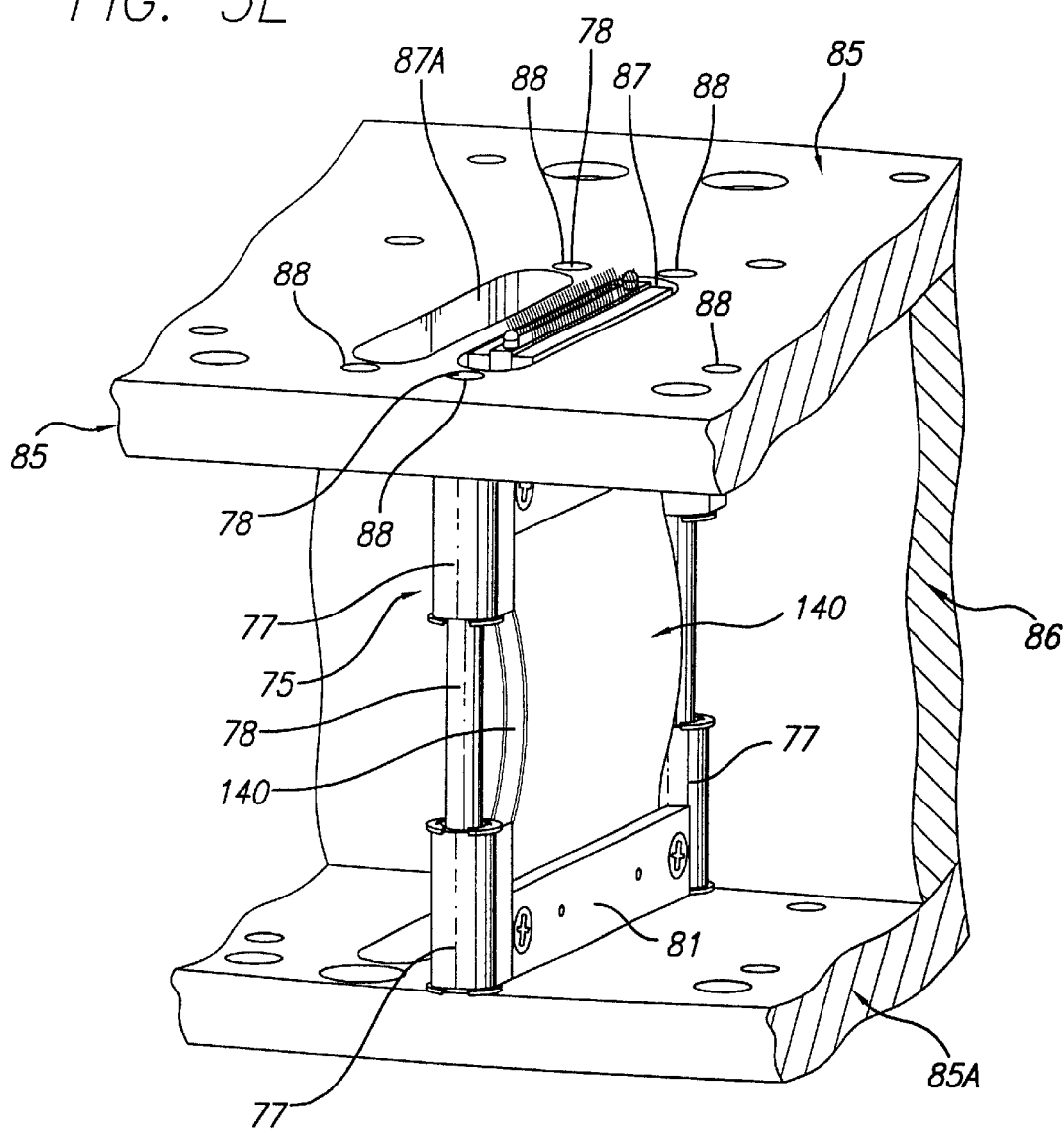

ALIGNMENT GUIDE AND SIGNAL TRANSMISSION APPARATUS AND METHOD FOR SPRING CONTACT PROBE NEEDLES

BACKGROUND OF THE INVENTION

The invention relates to spring contact probe needles for high frequency testing of integrated circuits and semiconductor wafers, and especially to providing accurate alignment and probe tip stability for spring probe needles, hereinafter referred to simply as probes, of the kind disclosed in FIGS. 2A–2G of commonly assigned patent "PROBE ASSEMBLY AND METHOD FOR SWITCHABLE MULTI-DUT TESTING OF INTEGRATED CIRCUIT WAFERS", U.S. Pat. No. 5,923,178 issued Jul. 13, 1999 by Higgins et al., entirely incorporated herein by reference. This invention also relates to similar probe assemblies for providing high frequency test signal transmission between a printed circuit board of an integrated circuit "tester" or "test system" and a probe card. The invention also relates to probe assemblies for providing high frequency test signal transmission between a printed circuit board of a test system and bonding pads of a large number of die of an integrated circuit wafer being tested.

U.S. Pat. No. 5,521,518 (Higgins), U.S. Pat. No. 5,589,781 (Higgins et al.), U.S. Pat. No. 5,416,429 (McQuade et al.), U.S. Pat. No. 4,554,506 (Faure et al.), U.S. Pat. No. 4,843,315 (Bayer et al.), U.S. Pat. No. 5,534,784 (Lum et al.) and U.S. Pat. No. 4,636,722 (Ardezzone) are generally indicative of the state of the art. It is known that insulative aluminum oxide is usually present on aluminum bonding pads of integrated circuit wafers. It also is known that there may be hundreds of integrated circuit die on a single semiconductor wafer and that it is necessary to "probe test" each die or device under test (DUT) before the wafer is cut into individual integrated circuit die. The die testing often needs to be performed at high speed or high frequency, for example at a 100 MHz data rate, or even much higher.

The above references disclose various known techniques for supporting "probe cards" that support a plurality of probes, tips of which must provide reliable electrical contact (i.e., low probe contact resistance) with the bonding pads of the DUT during the testing. The shank of a probe is typically 5 to 10 mils in diameter. In a typical probe test system, a "test head" supports an "interface assembly", that is supported between a "pin electronic board" of an integrated circuit test system and a "probe card" from which all of the probes required to probe test a particular semiconductor die extend. Typically, the wafer is supported on a "wafer chuck" of a "wafer probe machine" that automatically handles wafers. The chuck provides indexed translation in the x and y directions to bring the individual chip bonding pads into alignment with the probes supported by a probe card. The chuck ordinarily is moveable in the z (vertical) direction to press the chip bonding pads against the contact tips of the probe needles. After alignment of the probes with the corresponding bonding pads of the integrated circuit die, the wafer chuck and wafer thereon are raised approximately 3 mils so that the typically inclined probes "scrub" through brittle insulative aluminum oxide on the aluminum bonding pads of the wafer to allow good mechanical and electrical contact of the probe tip with the bonding pad metal and thereby ensure low probe contact resistance. It often would be desirable to perform the die testing at high frequencies, for example within a bandwidth of 2 to 6 Gigahertz or even much higher.

The C-shaped flex portions of the spring probes of the above referenced U.S. Pat. No. 5,923,178 have tips which extend beyond an insulative support. A problem of that structure is that the metal probe tips tend to be laterally skewed in various directions because of inaccuracies in the manufacturing process. This causes difficulty and inaccuracy in aligning the probe tips with the bonding pads of the integrated circuit under test. Another problem is that the probe tips have no lateral support in any direction, and therefore they tend to be somewhat unstable as they contact bonding pads as the wafer is raised so that its bonding pads are pressed against the spring probe tips.

Another problem with the structure of FIGS. 2A–2G of commonly assigned U.S. Pat. No. 5,923,178 is that the probe tips extend approximately 80–100 mils beyond the edge of the shank support structure and a ground plane associated with the shank support structure. This is a problem because although the portions of the probe needles supported on a thin insulator parallel to the ground plane act like a transmission line and provide very high bandwidth for test signals, the portions extending beyond the ground plane have appreciable inductance that significantly limits the bandwidth of probe test signals.

It would be beneficial to provide the numerous advantages of the "rocking tip" of the arcuate spring needles described in the above referenced commonly assigned U.S. Pat. No. 5,923,178 without the above mentioned disadvantages of probe tip misalignment, instability, and probe tip inductance.

There are applications other than wafer probing for probe assemblies with probes of the kind described above. One such application includes providing high speed electrical signal coupling to conductors of a printed circuit board or between conductors of different printed circuit boards, wherein the probes electrically contact corresponding conductors on the surface or surfaces of one or more printed circuit boards.

A problem of prior art interface assemblies coupling a pin electronics board of a typical integrated circuit test system to a printed circuit board portion of a probe card is the very large force, often many hundreds of pounds, required to compress the spring-loaded pins so that their opposite contact tips reliably contact conductors of the pin electronics board and corresponding conductors of the probe card. Another problem with such prior interface assembles is the relatively low density of test signal paths that can be provided therein. The number of test signal paths is limited by the large pitch, approximately 100 mils, of the probe conductors contacting the pin electronics board. This is in sharp contrast to the pitch of approximately 20 mils of contact pads on the printed circuit board portion of a typical probe card, and is even sharper contrast to the approximately 5 mil pitch for bonding pads of some integrated circuits. At the present state of the art of integrated circuit test systems, it is not practical to simultaneously produce the test signals needed to probe test more than approximately 64 chips of a semiconductor wafer, each chip having roughly 60 bonding pads. Nor is it practical at the present state of the art to provide enough electric circuitry on each pin electronics board driven by the integrated circuit test system to test more than four chips or "sites".

It would be desirable to provide an improved probe interface assembly for use between a "pin electronics board" of a typical integrated circuit tester and a probe card. It also would be highly desirable to provide an improved assembly for conducting a much higher "density" of high frequency test signals, with bandwidth in excess of several gigahertz, directly between the pin electronics board of a typical integrated circuit tester and probe needles contacting the bonding pads of an integrated circuit wafer than has previously been achieved. It also would be highly desirable to provide simultaneous high speed, uniform impedance signal transmission directly between the pin electronics board of a typical integrated circuit tester and to bonding pads of a large number of die, e.g., 128 or more die, in an integrated circuit wafer being tested.

SUMMARY OF THE INVENTION

Accordingly, it an object of the invention to provide a probe card having a high density of flex probes and which avoids problems associated with uncontrolled impedance along the signal paths through the flex probes, and which also provides improved flex probe alignment and stability compared to the prior art.

It is another object of the invention to provide a high density of probe needles in an integrated circuit probe testing assembly (e.g., a probe card) which provides reliable electrical contact of probe tips to integrated circuit bonding pads without causing "scrubbing", yet avoids problems associated with alignment, instability, and uncontrolled or non-uniform flex impedance associated with the curved flex probe structure described in the above referenced commonly assigned U.S. Pat. No. 5,923,178.

It is another object of the invention to provide a probe interface device including a high density of flex probes for coupling a large number of signals between corresponding conductors of separate printed circuit boards so as to provide improved alignment, stability and impedance properties.

It is another object of the invention to provide an improved interface device including a high density of flex probes for coupling a large number of test signals to/from corresponding conductors of at least one printed circuit board of a probe card assembly so as to provide improved alignment, stability and impedance properties compared to prior devices for coupling signals to/from conductors of a printed circuit board.

It is another object of the invention to provide an improved, controlled uniform impedance interface between the pin electronics board of an integrated circuit test system and a probe card.

It is another object of the invention to provide an interface assembly between a pin electronics board of an integrated circuit tester and a probe card, with a much higher density of test signal paths than has been achieved in the prior art.

It is another object of the invention to provide an interface assembly between a pin electronics board of an integrated circuit tester and a probe card which reduces the forces required to maintain reliable electrical contact between contact points of the interface system and corresponding conductors of the pin electronics board and the probe card.

It is another object of the invention to provide an interface assembly between a pin electronics board of an integrated circuit tester which allows parallel or simultaneous testing of as many as 128 or more integrated circuit die on a semiconductor wafer.

It is another object of the invention to provide high density, high speed, uniform, controlled impedance signal communication between a pin electronics board of an integrated circuit tester and bonding pads of an integrated circuit wafer being tested without use of a conventional probe card.

It is another object of the invention to provide high density, high speed, controlled impedance signal communication directly between a pin electronics board of an integrated circuit tester and bonding pads of an integrated circuit wafer being tested.

Briefly described, and in accordance with one embodiment thereof, the invention provides a probe assembly (14) including a plurality of probes (13 or 130) each having a shank portion (13A or 130A), a curved flex portion (13B or 130B) on a first end of the shank portion, and a contact tip on an end of the flex portion, thin dielectric material (16 or 180) of uniform thickness, each shank portion being supported in fixed parallel relation to a ground plane (25 or 132), each flex portion being moveable relative to the ground plane, at least part of each of the flex portions extending beyond an edge of the ground plane. In the described embodiments the dielectric material is smooth to allow guiding of the flex portions during flexing. The ground plane conductor and the dielectric material provide controlled, substantially uniform characteristic impedance and/or uniform signal transmission characteristics along the entire lengths of the probes.

Another embodiment of the invention provides an apparatus for high speed testing of an integrated circuit on a semiconductor wafer without substantial scrubbing so as to nevertheless achieve low probe needle contact resistance with low probe needle force, including a probe assembly (14) and a mechanical translating device 40. The probe assembly (14) includes a plurality of probe needles (13) each having a shank portion (13A), a curved flex portion (13B), and a contact tip (13C) on a free end of the flex portion, the shank portion (13A) being electrically coupled to an electrical test system, the shank portion (13A) of each probe being attached to a first surface (16A) of an insulative layer (16), a ground plane conductor (25) being attached to and supporting a second surface of the insulative layer (16). The flex portions (13B) of the probes (13) extend beyond an edge of the insulative layer (16). A portion (24) of the ground plane conductor (25) extends beyond the edge of the insulative layer (16) and is adjacent to all but an extending end (30) of the flex portion (13B) of each probe (13). A thin insulator/guide layer (26B) is attached to the extending portion (24) of the ground plane conductor (25) and is disposed between the extending portion (24) and the flex portions (13B) of the probes. The insulator/guide layer (26B) has a smooth, low friction surface to engage, guide, and stabilize the flex portions (13B) of the probes during flexing thereof, the insulative layer (16) and insulator/guide layer (269) providing matched impedance between the shank and flex portions of each of the probes. The mechanical translating device (40) operates to mechanically displace one of the semiconductor wafer (11) and probes (13) relative to the other to bring the contact tip (13C) of each probe into contact with a corresponding contact pad (12) of the semiconductor wafer (11) and to further mechanically displace one of the wafer and the probes relative to the other to increase a force of each contact tip (13C) against the corresponding contact pad (12) so as to flex the flex portion (13B) of each probe. The flex portion (13B) of each probe has a curvature such that the flexing causes the contact tip (13C) of that probe to rock without substantial sliding on the corresponding contact pad (12), the rocking and the needle force together cause lateral displacement of oxide from between the contact tips and the metal of the corresponding contact pad.

BRIEF DESCRIPTION OF THE DRAWINGS

FIG. 5E is a partial perspective view showing an interface module mounted between an upper and a lower support ring.

DETAILED DESCRIPTION OF THE PREFERRED EMBODIMENTS

By way of definition, when a "high density" of test signal paths between the pads of an integrated circuit wafer being test probed is referred to herein, what is meant is that there are enough test signals provided to enough flex probes contacting the bonding pads of the wafer to allow full simultaneous high frequency testing of at least 128 integrated circuit chips of the wafer; the definition assures that each integrated circuit chip includes at least roughly 30 to 60 bonding pads.

Figure 1:
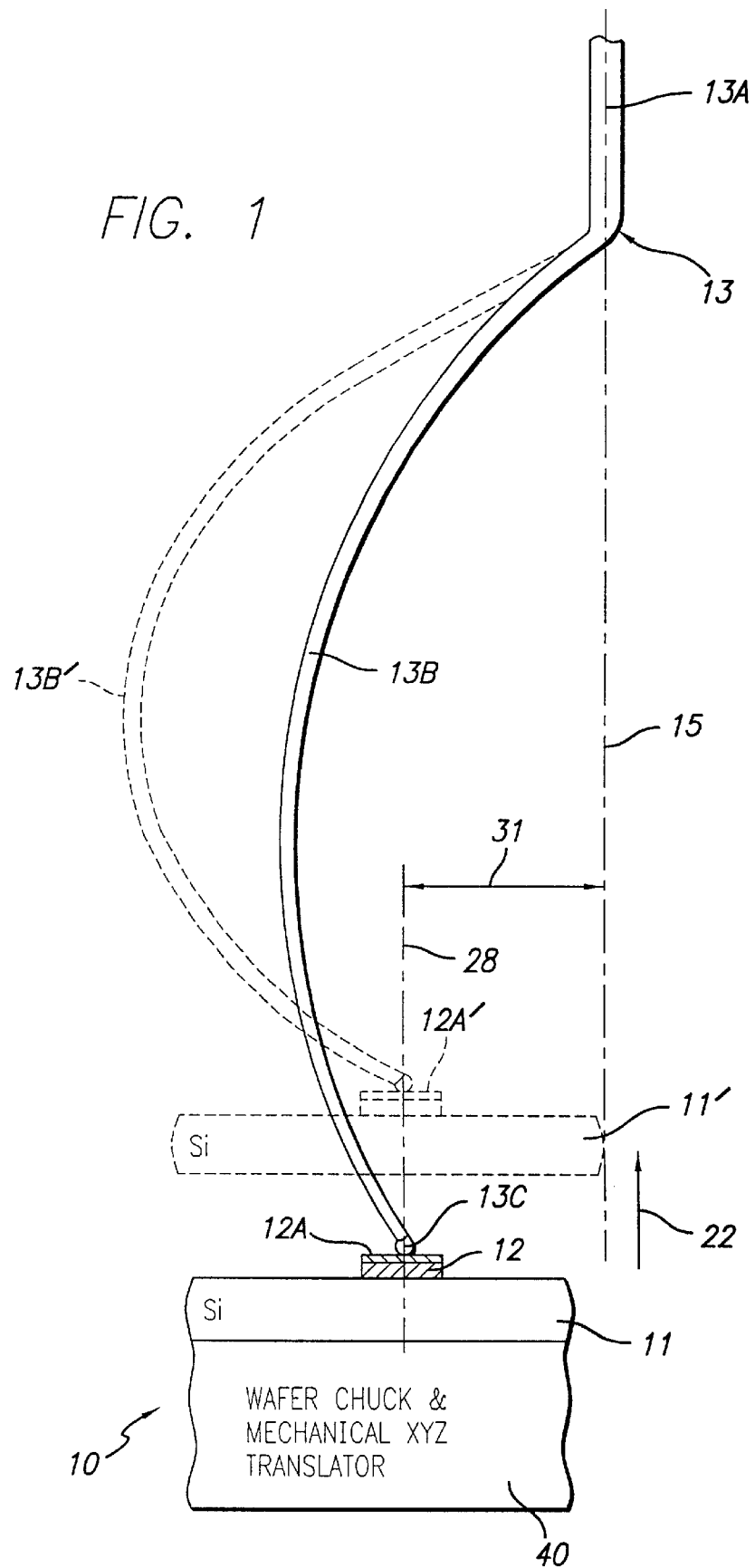
FIG. 1 is a partial side view diagram useful in describing the structure and operation of arcuate spring probes.
Figure 2:
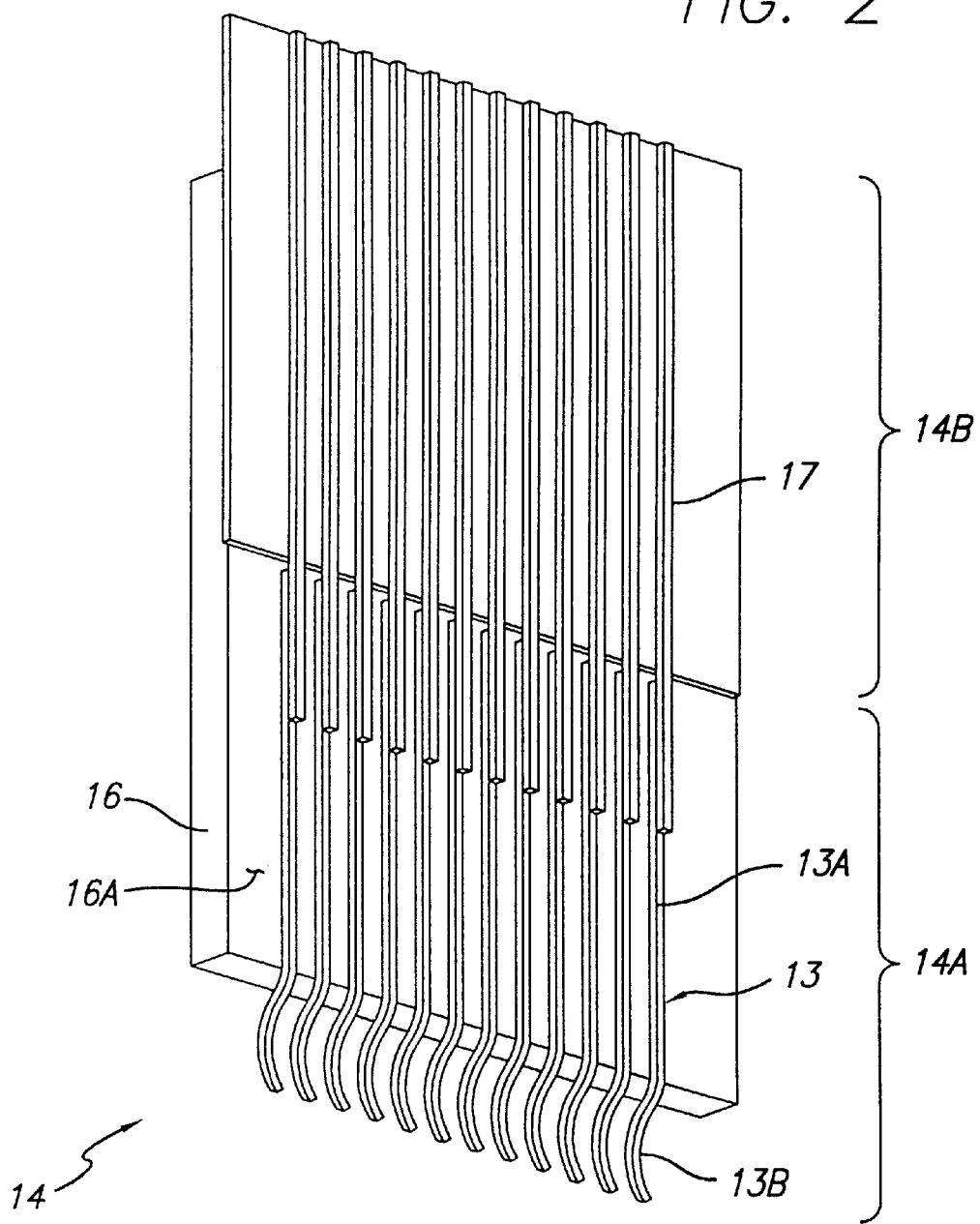
FIG. 2 is a perspective elevation view of an assembly including a plurality of the arcuate spring probes shown in FIG. 1 connected to a flex ribbon.

FIG. 1 illustrates the basic structure and operation of the spring type probe needles of commonly owned patent U.S. Pat. No. 5,921,178. Referring to FIG. 1, probe needle 13, hereinafter referred to as probe 13, includes a straight shank section 13A, the upper portion of which is connected to a conductor 17 of a flex ribbon assembly 18 shown in subsequently described FIG. 2. Probe 13 also includes a lower C-shaped flex portion 13B having a contact tip 13C. The curved flex portion 13B of each spring probe 13 extends below the edge of a dielectric 16 which is shown in FIG. 2. Contact tip 13C contacts a bonding pad 12 on an integrated circuit chip board die 11 of the semiconductor wafer supported by a wafer chuck (not shown).

Initially the aluminum bonding pad 12 on integrated circuit die 11 has the thin layer of brittle insulative aluminum oxide 12A thereon. Without the above described rocking of probe needle contact tip 13C, oxide 12A prevents probe contact tip 13C from making reliable electrical contact to the metal of aluminum bonding pad 12 unless the needle force of needle tip 13C on oxide layer 12A exceeds roughly 20 grams.

FIG. 1 illustrates how the flex portion 13B of a C-shaped probe 13 results in the above mentioned rocking of the probe contact tip 13C on the oxide coating 12A of a bonding pad 12 during a "touch down", wherein a semiconductor wafer including the die under test 11 is raised by a mechanism 40 including a wafer chuck and a mechanical XYZ translation device from an initial position and moved through an approximately 3 mil "overtravel" distance beyond the initial contact of probe tip 13C with the bonding pad to the location 11', causing flex portion 13B to flex into the configuration 13B' indicated by dotted lines in FIG. 1. With probe shank 13A stationary, the raising of the wafer chuck (not shown) and die 11 through the "overtravel" distance of approximately 3 mils and the resulting flexing of the C-shaped flex portion of probe 13 causes sufficient rocking or rotating of probe contact tip 13C to cause "micro-scrubbing" of the aluminum oxide 12A out from between the flexed portion 13B' and the metal 12A of aluminum bonding pad 12. The displaced aluminum oxide is indicated by numeral 12A' in FIG. 1, and is achieved with a contact tip force of only approximately 1–12 grams, rather than the above mentioned 20 grams, acting to press contact tip 13C against bonding pad 12.

In FIG. 1 dashed line 28 passes through the tip 13C of the flex portion 13B of probe 13 when it is unflexed. Dashed line 15 is parallel to the longitudinal axis of probe shank 13A. Distance 31 indicates an initial offset of contact tip 13C from axis 15 when flex portion 13B is unflexed. We have discovered that this offset distance 31 is necessary to prevent lateral force of contact tip 13C on bonding pad 12 as die 11 and flex portion 13B are moved upward as indicated by arrow 22 to provide the flexed configuration indicated by numeral 13B'. Thus, scrubbing of contact tip 13C against bonding pad 12 is avoided without use of an expensive, space-consuming lower guide template. (However, if it were desired to provide a predetermined amount of lateral force of contact tip 13C on bonding pad 12 as it is displaced from its initial position in FIG. 1 to the position indicated by numeral 62' so as to accomplish a desired amount of scrubbing, the offset distance 31 could be changed to accomplish that purpose.)

Referring now to FIG. 2, a flex ribbon/contact get subassembly 14 includes a shank portion 13A of each probe 13 adhesively attached to the major front surface 16A of a layer of ceramic dielectric 16. Probes 13 preferably are composed of nickel alloy material. Ceramic dielectric layer 16 can be composed of MACOR material, and may have a thickness of approximately 5 mils in order to achieve the desired controlled, uniform impedance path for the high frequency test signals conducted to/from the chip bonding pads. The width of ceramic dielectric layer 16 can be a suitable value which depends on the number of probes 13 to be supported. The height of ceramic dielectric layer 16 can be approximately 750 mils. The upper portion of the front face 16A of ceramic dielectric 16 as shown in FIG. 2 is adhesively attached the inner face of the lower portion of a conventional elongated flex ribbon 14B, which can be composed of KAPTON polyimide and copper conductors 17 formed thereon. The plurality of copper conductors 17 are adhesively attached to the outer face of flex ribbon 14B.

The lower end of each conductor 17 is mechanically attached and electrically connected to the upper end of the shank 13A of each probe 13. Flex ribbon 14B and copper conductors 17 thereof are routed to connect the various conductors 17 to corresponding terminals of connectors such as connectors 32 in FIG. 2C of above incorporated-by-reference U.S. Pat. No. 5,923,178. Connectors 32 are connected to a printed circuit board of interface circuitry for connection to a suitable wafer probe test system that supplies operating power to the die under test, generates the necessary high frequency test signals, and measures the responsive signals produced by the integrated circuitry of the chips of the wafer being tested.

Figure 3:
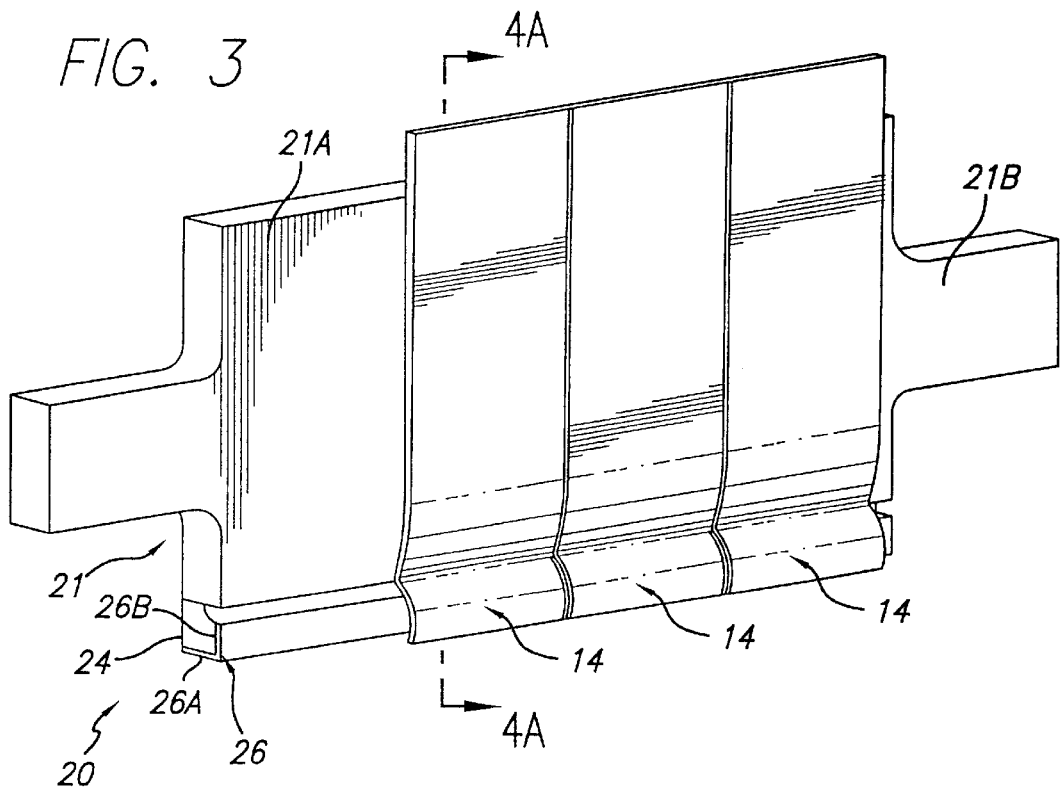
FIG. 3 is a perspective view of the present invention, including a plurality of the spring probe assemblies shown in FIG. 2 attached to a metal base support and providing the insulator/guide structure of the present invention.

Referring next to FIG. 3, a flex ribbon/contact set assembly 20 includes three of the flex ribbon/contact set subassemblies 14 of FIG. 2, adhesively attached side-by-side to the surface 21A of metal base 21. Metal base 21 can be composed of stainless steel. A high conductivity ground plane 25 (FIG. 4A) can be interposed between the back surface of ceramic dielectric 16 and the front face 21A of metal base 21. In a prototype of the invention, a grounded metal support bar 24 is attached by electrically conductive epoxy to the bottom surface of metal base 21 and is maintained at a ground potential so as to function as a ground plane. However, metal support bar 24 could be integral with metal base 21. (By way of definition, the term "ground plane conductor" is intended to encompass a single ground plane conductor or a plurality of ground plane conductors that are all electrically connected to each other.) An insulator/guide 26 has a lower horizontal section 26A adhesively attached to the bottom surface of metal support bar 24 and also has an integral vertical section 26B adhesively attached to the front surface of metal support bar 24. The front surface of vertical section 26B of insulator/guide 26 is parallel to probes 13. Insulator/guide 26 can be composed of TORLON polyamide-imide material (although other material such as Teflon could be used instead), and may have a thickness of approximately 5 mils so as to achieve the desired transmission line properties and controlled uniform characteristic impedance (typically approximately 50 ohms) of the signal path along each probe 13.

The flex portion 13B of each probe 13 preferably slideably abuts or nearly abuts the outer face of the vertical section 26B of insulator/guide 26. This serves to align the curved flex sections 13B of the multiple probes 13 and eliminate the previously mentioned skew so that all of the contact tips 13C of the probes 13 are precisely aligned with each other. When the curved flex sections 13B of probes 13 are flexed as shown in FIG. 1 by numeral 13B', their side edges easily slide against the smooth outer face of vertical section 26B of insulator/guide 26. This maintains the alignment of the probe contact tips 13C during the flexing. The vertical face 24B (FIG. 4) of metal support bar 24 functions electrically as an extension of ground plane 25, so the entire length of each probe 13 except for the approximately 25 mils or less portion 30 extending below metal support 24 functions as a transmission line, thereby providing uniform, controlled impedance of the flex portions 13B except for the approximately 25 mil tip portions 30 extending below grounded metal support bar 24.

What is meant by "controlled" impedance is that the impedance along the entire length of the probe 13, except for the short distance by which the contact tips extend beyond the edge of the ground plane, is within approximately ±10 percent of the nominal characteristic impedance value, and the short distance referred to is small enough that it has little effect on the test signals being driven down the probes 13 by the integrated circuit test system at the frequencies of interest. For example, if the nominal impedance of the shank portion 13A and the part of the flex portion adjacent to the ground plane is 50 ohms, the "uncontrolled" impedance at the several mil tip portion extending beyond the ground plane might be approximately 70 ohms, but the short distance is so small that the test signals at frequencies as high as about 4 to 6 gigahertz are not affected much.

Figure 4A:
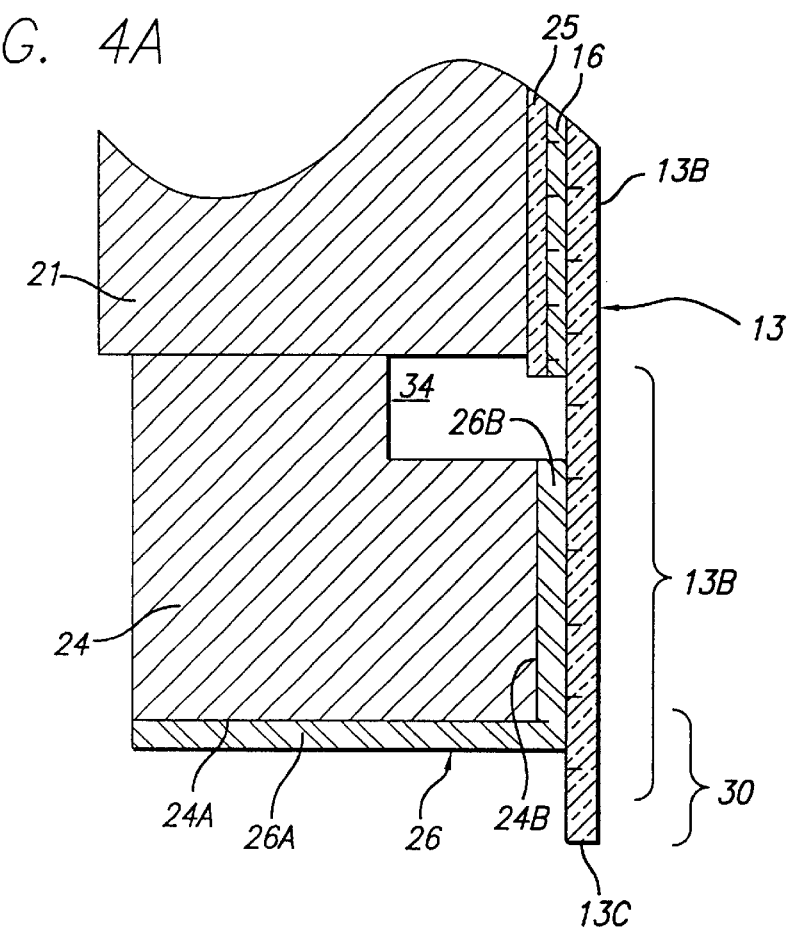
FIG. 4A is a partial section view taken through one of the arcuate spring probes in the insulator/guide structure shown in FIG. 3.
Figure 4B:
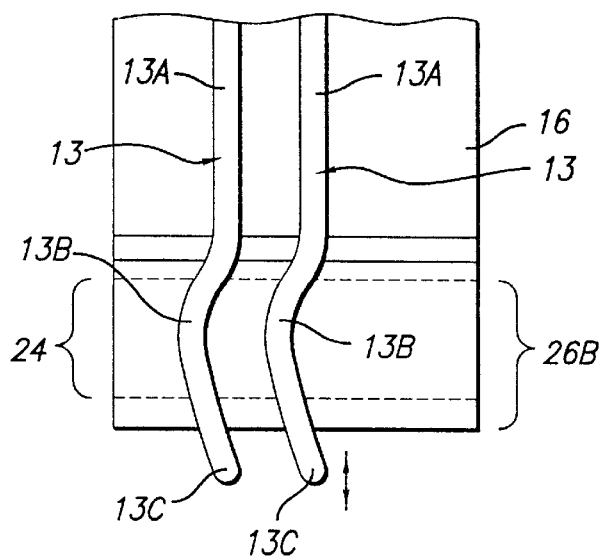
FIG. 4B is a partial front elevational view of the assembly shown in FIG. 4A.

The distance that section 30 of flex portion 13B and tip 13C of flex probe needle 13 extend below ground plane conductor 24 usually is specified to have a value selected to ensure that there is no damage to the wafers being probed as the wafer or probe guard assembly 36 is moved to cause a "touch down" of the needle contact tips 13C against the corresponding bonding pads 12 (FIG. 1). The amount of inductance associated with the lowest portion 30 of each probe 13 is fairly negligible at test signal bandwidths of 4–6 gigahertz. The void 24 in FIG. 4A in the described prototypes of the invention, with a width of 20 mils and a height of 10 mils as shown in FIG. 4A, is present to allow convenient removal of debris from the prototype shown in FIG. 4A. However, void 34 has been found to have a negligible effect on the impedance of the signal path along the flex probe needle 13.

The above described embodiment of the invention allows integrated circuit testers with bandwidths of 4–6 gigahertz and providing a very high density of test probe signals with frequencies as high as about 400–600 megahertz to be simultaneously provided to and received from the roughly 60 bonding pads of approximately 8 to 64 die of the wafer being tested.

FIGS. 5A–5F illustrate another embodiment of the invention in which flex probes and insulator/guide elements are included in a low force, high density interface contact set for providing high density coupling of high speed (e.g., as high as 1 gigahertz or even higher) test signals between corresponding conductors of separate printed circuit boards or, if the paths of the subsequently described probe 130 are tapered or fanned out, directly between bonding pads of an integrated circuit chip, and corresponding conductors of a pin electronics board of an integrated circuit tester. This embodiment provides a very constant, controlled impedance path for each test signal.

In the embodiment of FIGS. 5A–5F, an interface module 75 provides the function of conducting test signals between corresponding conductors of a pin electronics board of a typical integrated circuit tester and a probe card. Interface module 75 includes a pair of flex ribbon/contact sets 140 which are similar to the previously described flex ribbon/contact subassemblies 14 of FIG. 2, except that in FIGS. 5A–E flex ribbon/contact sets 140 each include probes 130 that each have a straight shank section 130A and a C-shaped flex section 13OR at each end. (Further details of flex ribbon/contact sets 140 are described subsequently with reference to FIG. 5F).

Figure 5A:
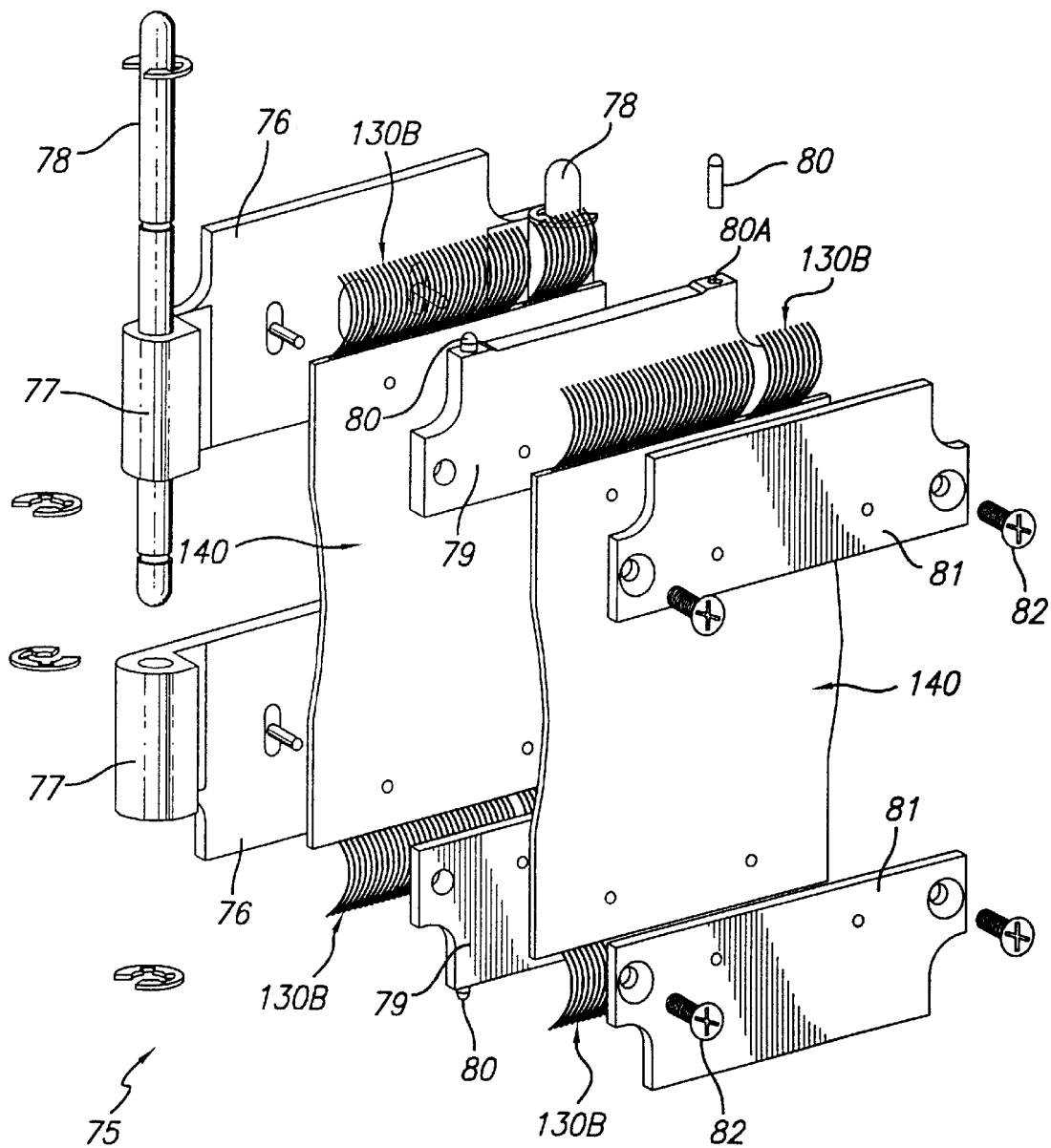
FIG. 5A is a perspective exploded assembly diagram of an interface probe module for coupling between contact pads of a pair of printed circuit boards.

Referring to FIG. 5A, one of flex ribbon/contact sets 140 is positioned between a pair of flat, rigid metal guide plates 76 and a pair of flat metal spacer plates 79 aligned therewith. A cylindrical bearing 77 is rigidly attached to each end of each of the four guide plates 76. The four bearings 77 are aligned as shown in FIG. 5A so that precision cylindrical alignment shafts 78 can be inserted through the cylindrical holes in bearings 77 as shown. The second flex ribbon/contact set 140 is mounted between flat spacer plates 79 and flat rigid clamp plates 81. The entire module 73 is fastened together by means of four screws 82.

The upper guide plates 76 can slide along shafts 78 independently of the lower guide plates 76 because the bearings 77 can slide on alignment shafts 78 and also because the flex ribbon contact sets 140 have mid-portions which can elastically flex to allow such independent movement of the various guide plates 76 along the shafts 78. Such flexing of the mid portions of the flex ribbon contact sets 140, combined with flexing of the C-shaped flex portions 140B thereof provides an amount of compliance selected to allow reliable electrical contact between the contact tips of the C-shaped sections 130B and the corresponding conductors of the pin electronics board and the probe card. A total of approximately 80 mils of compliance, including 20 mils for each flex portion 140B and 20 mils for each guide plate 76, has been determined to be an adequate amount for this purpose.

Figure 5B:
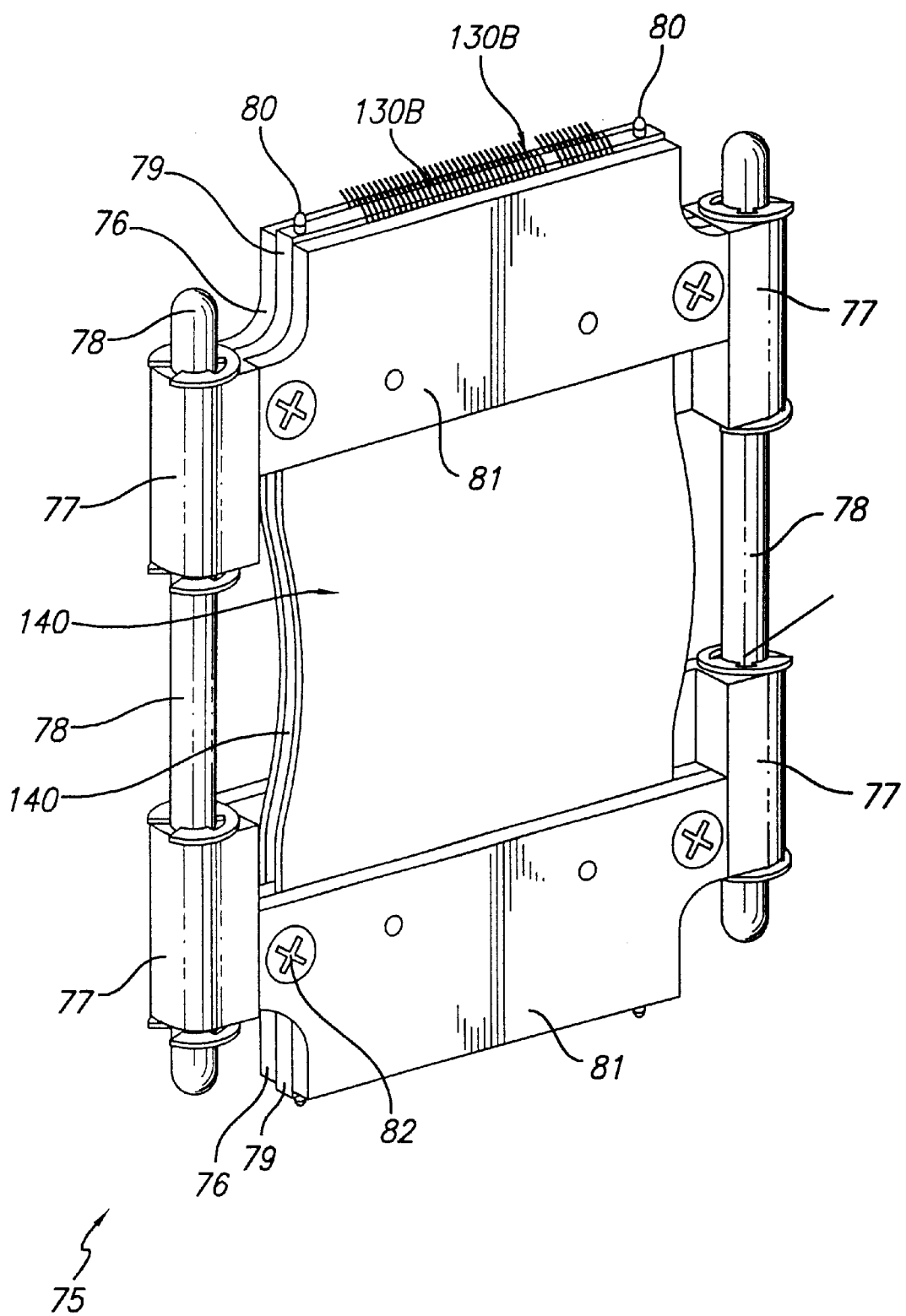
FIG. 5B is a diagram of the assembled interface probe module of FIG. 5A.

The dimensions of a prototype of the assembled module shown in FIG. 5B are approximately 2 inches in height, 1 inch in width, and 0.375 inches in thickness.

Figure 5C:
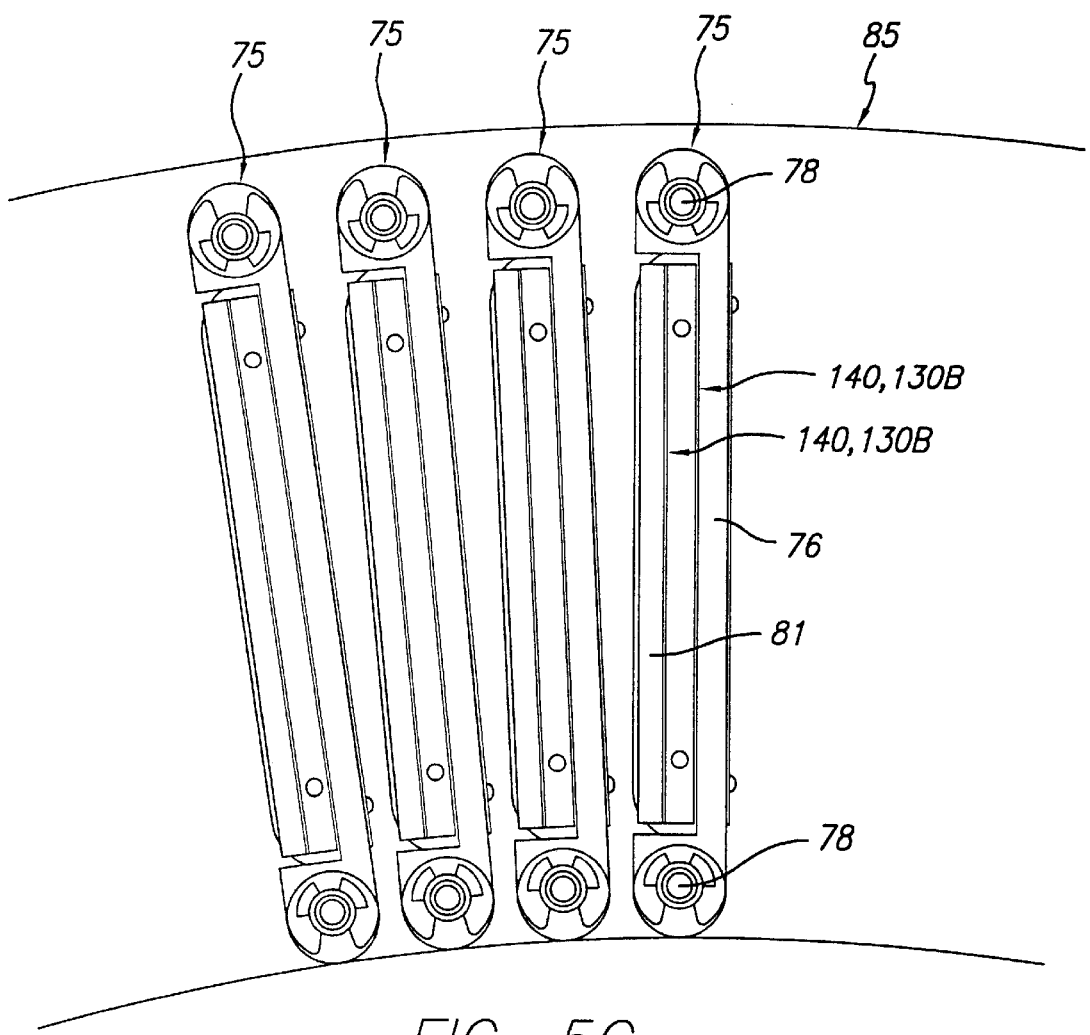
FIG. 5C is a top view diagram of a plurality of the interface modules of FIG. 5B mounted in a support ring.

FIG. 5C shows a top plan view of four of the interface modules 75 installed in slots in an upper annular support ring 85, which might be 12 inches in diameter and 0.25 inches thick and a similar lower ring.

FIG. 5E shows the lower ring 86A. Rings 85 and 86A are rigidly attached to a wall 86. In one prototype embodiment, the support ring 85 may support as many as 128 interface modules 75, to allow simultaneous transmission of as many as 10,000 signals between the pin electronics board of a typical integrated circuit teeter and a probe card or a semiconductor wafer. This will allow simultaneous testing of as many as 128 chips on a semiconductor wafer to provide complete testing at bandwidths as high as approximately 4 to 6 Gigahertz and with test signal frequencies as high as approximately 0.14 times the bandwidth, i.e., 800–840 Megahertz.

Figure 5D:
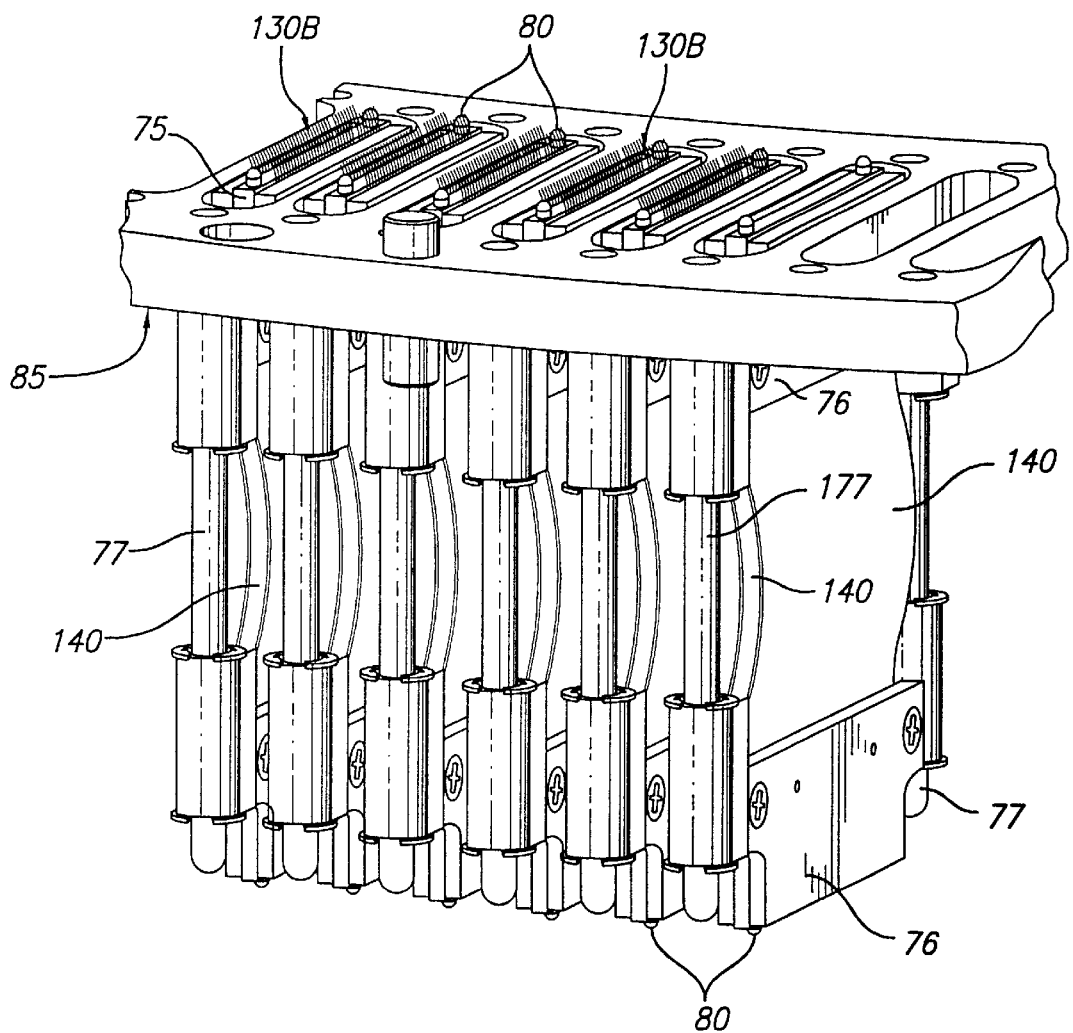
FIG. 5D is a perspective view of the plurality of interface modules shown in FIG. 5C mounted in the support ring.

FIG. 5D shows a partial perspective view of the assembly of FIG. 5C, wherein it is clearly illustrated how the C-shaped flex sections 130B extend slightly above the spacer plates 79. Similarly, at the lower end of each flex ribbon contact set 140 the corresponding arcuate probe tips 130B extend downward. Numerals 80 designate conventional spring-loaded grounding probes which contact corresponding grounding conductors on the pin electronics board and the PCB portion of the probe card. The tips of the upper flex portions 130B engage corresponding conductors of the pin electronics board (not shown) when support ring 85 is clamped against the pin electronics board.

Figure 5F:
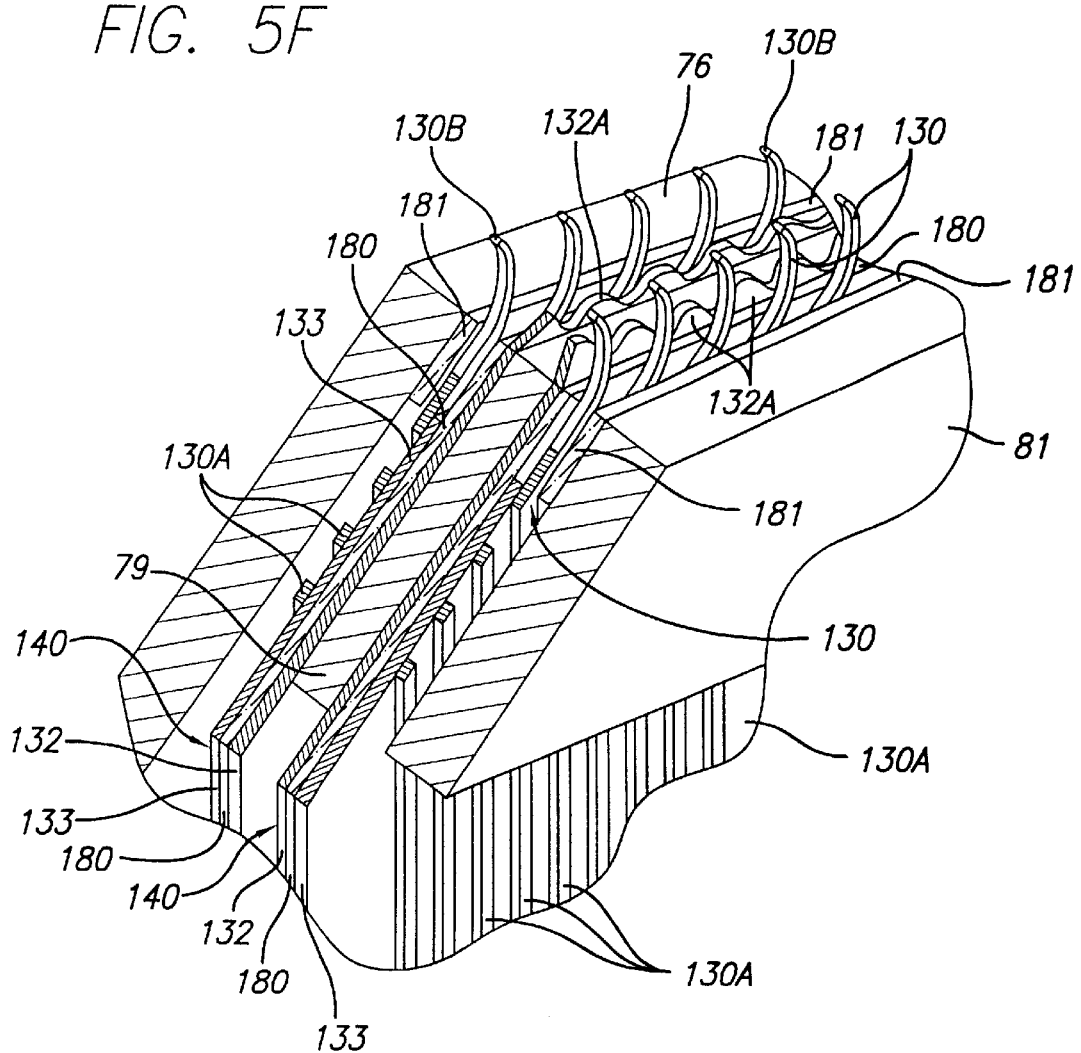
FIG. 5F is a partial perspective cutaway diagram of one of the flex-ribbon contact sets 140 of FIG. 5A.

FIG. 5F shows the details of each flex ribbon/contact set 140, each of which includes a ground plane layer 132 adhesively attached by adhesive layer 133 to one face of a dielectric layer 180. The ground plane 132 can be composed of metal, and the dielectric layer 180 can be composed of polyimide material. Each probe 130 includes a straight shank section 130A and two opposed C-shaped flex portions 130B, one at each end of the shank section 130A. The shank sections 130A are adhesively attached by an adhesive layer 133 to the opposite surface of the dielectric layer 180. However, the C-shaped flex portions 140B are not adhesively attached to dielectric layer 180, and therefore are free to flex and be guided and/or stabilized by the dielectric layers 180 and auxiliary dielectric layers 181. Only approximately 20 mils of the tip portion of each C-shaped flex section 140B extends beyond the upper edges of the dielectric layer 180.

The ground planes 132 extend to the edges of the dielectric layers 180, so that controlled, uniform impedance is provided for all but the very short 20 mil portions of tip portions of the flex sections 130B extending beyond the ground plane 132. The extending edges 132A of ground planes 132 include wavy sections as shown in order to provide the compliance needed to accomplish better electrical contact at more points along the surface of a contact pad or conductor that is not perfectly flat.

Figure 6C:
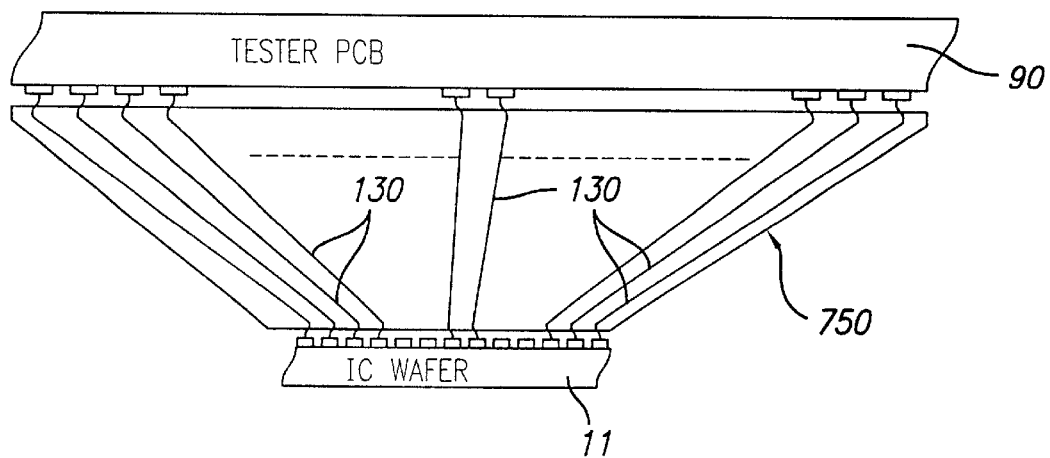
FIGS. 6A–C are diagrams useful in explaining another embodiment of the invention.
Figure 6A:
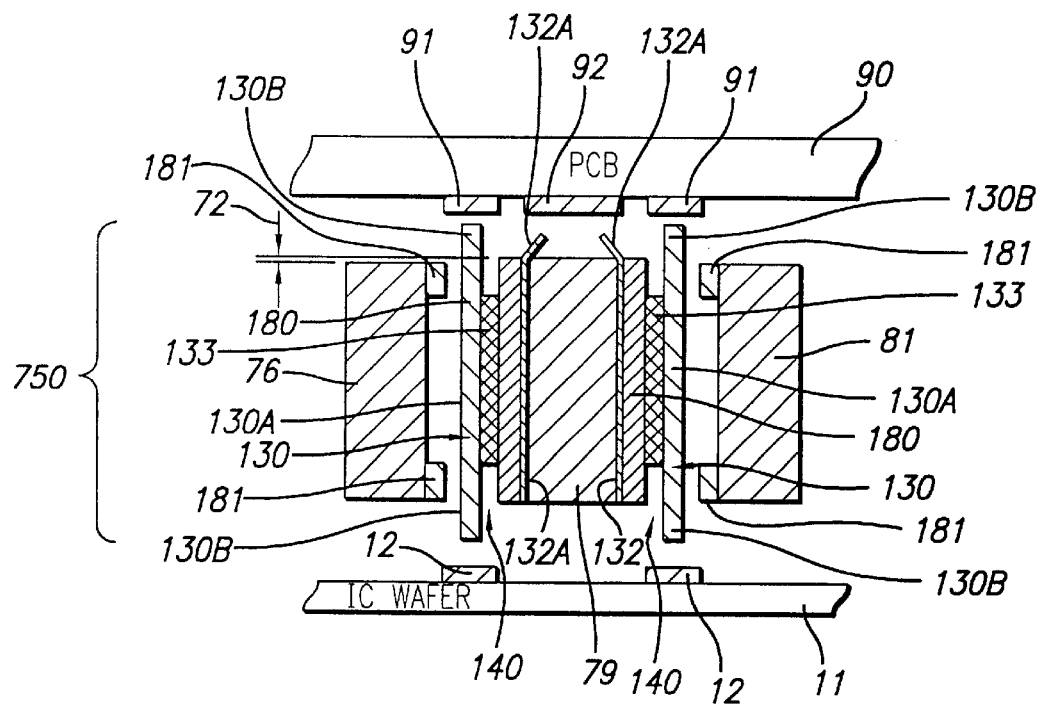
Figure 6B:
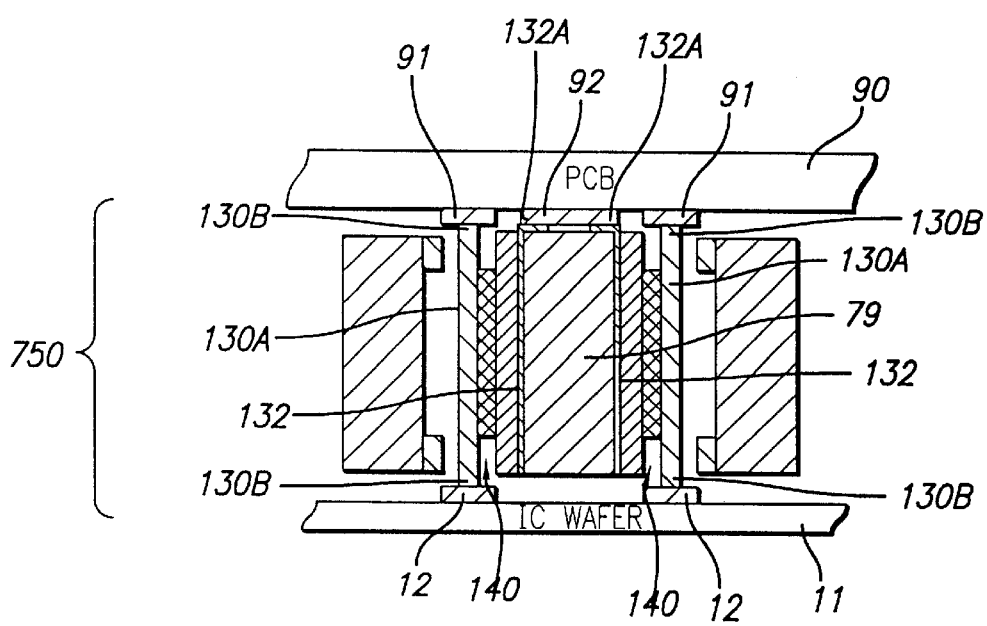

FIGS. 6A–6C show another embodiment of the invention, wherein each module 750 includes two flex ribbon/contact sets 140 similar to previously described flex ribbon/contact sets 140 in FIGS. 5A–5E. Each flex ribbon/contact set 140 includes a ground plane 132 laminated or attached to one surface of a dielectric layer 180, an adhesive layer 133 attached to the opposite surface of the dielectric layer 180, a plurality (e.g., one to over 100) of probes 130 each having a shank 130A attached to the adhesive layer 133, and a pair of C-shaped flex portions 130B, one at each of the opposite ends of the shank portion 130A.

The C-shaped flex portions 130B are free to flex because they are not adhesively attached to anything. The two flex ribbon/contact sets 140 are clamped or sandwiched between a central metal spacer plate 79 and a pair of clamp plates 76 and 81, respectively, opposite faces of the spacer plate 76 contacting the two ground plane layers 132. Suitable screws and standoffs (not shown) extend between clamp plate 76 and spacer plate 79, and also between clamp plate 81 and spacer plate 79, to maintain equal gaps between the probes 130 and adjacent dielectric layer 180 and secondary dielectric layers 181. The secondary dielectric strips 181 are affixed to clamp plates 76 and 81 adjacent the outer edges of the C-shaped flex portions 130B both to prevent them from contacting clamp plates 76 and 81 and also to guide and stabilize the flex portions 130B as the modules 750 are compressed between a printed circuit board (PCB) 90 and an integrated circuit wafer 11.

The upper edges 132A of ground planes 132 extend above the upper edges of spacer plate 79 and dielectric layers 180. The upper edges 132A of ground planes 132 also are aligned with an elongated ground conductor 92 of PCB 90. The contact tips of the upper flex portions 130B are aligned with corresponding input/output (I/O) pads 91 on the lower surface of PCB 90. The contact tips of the lower flex portions 130B are aligned with bonding pads 12 of adjacent die of integrated circuit wafer 11. The metal spacer plate 79, metal clamp plates 76 and 81, and metal ground planes 132 all are electrically connected together.

As shown in FIG. 6A, the upper edge surface of spacer plate 79 and the upper edges of dielectric layers 180 extend a small distance 72 of approximately 5 mils above the upper edges of clamp plates 76 and 81. When the upper portion of module 750 is compressed against PCB 90, bonding pad 92 flattens the upper ground plane edges 132A against the upper face of metal spacer 79, as shown in FIG. 1B, and the contact tips of the upper flex portions 130B contact I/O bonding pads 91, as shown.

When integrated circuit wafer 11 is compressed against the lower portion of module 750, the contact tips of lower C-shaped flex portions 130B contact bonding pads 12 as shown, but the ground planes 132 do not touch wafer 11.

A suitable "uncompressed" size (i.e., length) for the upper flex probes 130B in their "uncompressed" configuration is approximately 250 mils; a suitable "compressed" size in their "compressed" configuration is approximately 230 to 235 mils. For the lower flex probes 130B in their uncompressed configuration a suitable size (i.e., length) is approximately 105 mils, and in their compressed configuration a suitable size is approximately 100 mils.

The "compressed" structure shown in FIG. 6B provides very good electrical contact between ground conductor 92 of PCB 90 and ground planes 132 of the two flex ribbon contact sets 140. This results in a nearly ideal transmission line structure for the high frequency test signals conducted between the IC test system and the integrated circuit wafer 11, with uniform transmission line impedance along the shank portions 130A. A nearly ideal transmission line structure and uniform characteristic impedance is achieved for the entire test signal path from the integrated circuit test system to the integrated circuit wafer bonding pads 12, except for the last approximately 100 mils at which there is an air gap between the lower edges of ground plane conductors 130A and the upper surface of the integrated circuit wafer 11 causing the characteristic impedance to increase from approximately 50 ohms to approximately 70 ohms.

The foregoing structure can provide a very high density of test signals, with high 4–6 gigahertz bandwidth. For example, if the probes 130 of each flex ribbon/contact set 140 are "fanned out" as shown in FIG. 6C from the wafer bonding pads, with their typical spacing of approximately 5 mils between bonding pads, to the much larger spacing of, for example, 100 mils between I/O conductors of the tester printed circuit board 90, then the density of test signal paths can be increased to a level of approximately 10,000 probes 130 within an approximately 2–3 inches square area allocated for this purpose, and requiring a total clamping force of only approximately 450 pounds which allows simultaneous probe testing of 128 or more integrated circuits on an integrated circuit wafer.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention. The flex portions 130B can be provided on both ends of the probes 13. The flex portions 130B can be of different sizes to meet different compliance requirements. The flex portions 130B can be provided on only one end of an interface module 75 or 750, and a connector or pogo pin assembly or the like can be provided on the other end. Some or all of the dielectric could be air, with suitable structure holding the shanks 130A in fixed parallel relation to the ground planes; use of air as a dielectric can result in improved signal transmission performance. A mixed dielectric could be used having different values of dielectric constant along the lengths of the probes so as to maintain the characteristic transmission line impedance as constant as practical.

What is claimed is:

1. A probe assembly comprising:
   (a) a plurality of probes each having a shank portion, a curved flex portion on an end of the shank portion, and a contact tip on an end of the flex portion;
   (b) a ground plane conductor parallel to the probes, each shank portion being disposed in fixed relation to the ground plane, each flex portion being moveable in a direction parallel to the ground plane, part of each flex portion extending beyond an edge of the ground plane; and
   (c) thin dielectric material of uniform thickness between the probes and the ground plane, the ground plane conductor and the dielectric material extending beyond the shank portion of each probe and along substantially the entire length of the flex portion of each probe, wherein the ground plane conductor and the dielectric material provide controlled, substantially uniform signal transmission characteristics along the entire length of each probe at frequencies below a predetermined value.

2. The probe assembly of claim 1 wherein at least a portion of the thin dielectric material is solid and has a smooth surface adjacent to the flex portions to guide them during flexing.

3. A probe assembly comprising:
   (a) a plurality of probes each having a shank portion, a curved flex portion on an end of the shank portion, and a contact tip on an end of the flex portion;
   (b) thin dielectric material of uniform thickness, each shank portion being disposed along and in fixed parallel relationship to a first surface of the dielectric material, each flex portion being adjacent to and moveable relative to the first surface; and
   (c) a ground plane conductor on a second surface of the dielectric material, part of each flex portion extending beyond an edge of the ground plane, the ground plane conductor and the dielectric material extending beyond the shank portion of each probe and along substantially the entire length of the flex portion of each probe, the first surface of the dielectric material being smooth to allow guiding of the flex portions during flexing thereof, wherein the ground plane conductor and the dielectric material form a transmission line to provide controlled, substantially uniform characteristic impedance along the entire length of each probe.

4. A probe assembly comprising:
   (a) a plurality of probes each having a shank portion, a curved first flex portion on an end of the shank portion, and a contact tip on an end of the first flex portion;
   (b) thin dielectric material of uniform thickness, each shank portion being attached to a first surface of the dielectric material, each first flex portion being adjacent to and moveable relative to the first surface; and
   (c) a ground plane conductor on a second surface of the dielectric material, at least part of each first flex portion extending beyond an edge of the ground plane, the ground plane conductor and the dielectric material extending beyond the shank portion of each probe and along substantially the entire length of the flex portion of each probe, the first surface of the dielectric material being smooth to allow guiding of the first flex portions during flexing thereof, wherein the ground plane conductor and the dielectric material provide controlled, substantially uniform characteristic impedance along the entire length of each probe.

5. The probe assembly of claim 4 wherein the dielectric material is part of a flex ribbon including the plurality of shank portions, the probe assembly including a connector having a plurality of contact conductors each electrically connected to a second end of a corresponding shank portion to effectuate electrical connection of a probe assembly to a pin electronics board of an integrated circuit test system.

6. The probe assembly of claim 4 including a curved second flex portion on a second end of each shank portion adjacent to and moveable relative to the first surface, wherein a part of each second flex portion extends beyond a second edge of the ground plane to guide the second flex portions during flexing thereof.

7. The probe assembly of claim 6 adapted to press the contact tips of the first flex portions against corresponding conductors of a pin electronics board of an integrated circuit test system, and also adapted to press the contact tips of the second flex portions against corresponding bonding pads of an integrated circuit.

8. The probe assembly of claim 4 wherein the shank portions are parallel.

9. The probe assembly of claim 4 wherein spacings between the contact tips of the second flex portions are much less than the spacings between the contact tips of the first flex portions, and the shanks fan out from corresponding second flex portions to corresponding first flex portions, respectively.

10. An apparatus for testing an integrated circuit on a semiconductor wafer so as to achieve a high density of test signal paths and also effectuate use of high frequency test signals, the apparatus comprising:
    (a) a probe assembly including i. a plurality of probes each having a shank portion, a curved first flex portion on a first end of the shank portion, and a contact tip on an end of the first flex portion, ii. thin dielectric material of uniform thickness, each shank portion being attached to a first surface of the dielectric material, each first flex portion being adjacent to and moveable relative to the first surface, and iii. a ground plane conductor on a second surface of the dielectric material, part of each of the first flex portions extending beyond an edge of the ground plane, the ground plane conductor and the dielectric material extending beyond the shank portion of each probe and along substantially the entire length of the flex portion of each probe, the first surface of the dielectric material being smooth to allow guiding of the first flex portions during flexing, wherein the ground plane conductor and the dielectric material provide controlled, substantially uniform characteristic impedance along the entire lengths of the probes; and (b) a mechanical translating device operative to mechanically displace one of a semiconductor wafer and the probes relative to the other to bring the contact tip of each probe into contact with a corresponding contact pad of the semiconductor wafer, and to further mechanically displace one of the wafer and the probes relative to the other to increase a force of each contact tip against the corresponding contact pad to flex the first flex portion.

11. The apparatus of claim 10 wherein the dielectric material is part of a flex ribbon including the plurality of shank portions, the probe assembly including a connector having a plurality of contact conductors each electrically connected to a second end of a corresponding shank portion to effectuate electrical connection of a probe assembly to a pin electronics board of an integrated circuit test system.

12. The apparatus of claim 10 including a curved second flex portion on a second end of each shank portion adjacent to and moveable relative to the first surface, wherein at least a part of each second flex portion extends beyond a second edge of the ground plane to guide the second flex portions during flexing thereof.

13. The apparatus of claim 12 adapted to press the contact tips of the first flex portions against corresponding conductors of a pin electronics board of an integrated circuit test system, and also adapted to press the contact tips of the second flex portions against corresponding bonding pads of an integrated circuit.

14. The apparatus of claim 10 wherein the shank portions are parallel.

15. The apparatus of claim 10 wherein spacings between the contact tips of the second flex portions are much less than the spacings between the contact tips of the first flex portions, and the shanks fan out from corresponding second flex portions to corresponding first flex portions, respectively.

16. A method of using a probe assembly to conduct high frequency signals between a first set of conductors and a second set of conductors, respectively, the second set of conductors being located a substantial distance from the first set, comprising:

(a) providing i. a plurality of probes each having a shank portion, a curved flex portion on an end of the shank portion, and a contact tip on an end of the flex portion, ii. a ground plane conductor parallel to the probes, each shank portion being disposed in fixed relation to the ground plane, each flex portion being moveable parallel to the ground plane, part of each first flex portion extending beyond an edge of the ground plane, and iii. thin dielectric material of uniform thickness between the probes and the ground plane, the ground plane conductor and the dielectric material extending beyond the shank portion of each probe and along substantially the entire length of the flex portion of each probe, wherein the ground plane conductor and the dielectric material provide controlled, substantially uniform characteristic impedance along the entire length of each probe at frequencies below a predetermined value;

(b) pressing the conductors of the second set against the contact tips, respectively, so as to flex the flex sections; and (c) applying high frequency signals on the conductors of the first set to a second end of the shank portions, respectively, the ground plane conductor and the dielectric material providing controlled, substantially uniform signal transmission characteristics to the high frequency signals as they propagate along the probes, respectively.

17. A method for testing an integrated circuit on a semiconductor wafer so as to both achieve a high density of test signal paths and use of high frequency test signals, comprising:

(a) using a probe assembly to conduct high frequency signals between a first set of conductors and a second set of conductors located a substantial distance from the first set by providing i. a plurality of probes each having a shank portion, a curved flex portion on a first end of the shank portion, and a contact tip on an end of the flex portion, the shank portion being electrically coupled to a test system, ii. thin dielectric material of uniform thickness, each shank portion being attached to a first surface of the dielectric material, and iii. a ground plane conductor on a second surface of the dielectric material, part of the flex portions extending beyond an edge of the ground plane, the ground plane conductor and the dielectric material extending beyond the shank portion of each probe and along substantially the entire length of the flex portion of each probe, the dielectric material having a smooth surface to guide the flex portions during flexing;

(b) pressing the conductors of the second set against the contact tips, respectively, so as to flex the flex sections;

(c) applying the high frequency signals on the conductors of the first set to a second end of the shank portions, respectively, wherein the ground plane conductor and the dielectric material provide controlled, uniform characteristic impedance along the probes; and (d) operating a mechanical translating device to mechanically displace one of the semiconductor wafer and the probes relative to the other to bring the contact tip of each probe into contact with a corresponding contact pad of the semiconductor wafer and to further mechanically displace one of the wafer and the probes relative to the other to increase a force of each contact tip against the corresponding contact pad to flex the flex portion.

18. A probe assembly comprising:

(a) a plurality of probes each having a shank portion, curved first and second flex portions on first and second ends of the shank portion, respectively, and a contact tip on an end of the first and second flex portions, respectively;

(b) thin first dielectric material of uniform thickness, each shank portion being attached to a first surface of the first dielectric material, each first flex portion and second flex portion being adjacent to and moveable relative to the first surface;

(c) a ground plane conductor on a second surface of the first dielectric material, part of each of the first and second flex portions extending beyond first and second edges, respectively, of the first dielectric material, the ground plane conductor and the dielectric material extending beyond the shank portion of each probe and along substantially the entire lengths of the first and second flex portions of each probe, the first dielectric material being smooth to allow guiding of the first and second flex portions during flexing thereof, wherein the ground plane conductor and the first dielectric material provide controlled, substantially uniform signal transmission characteristics along the entire length of each probe; and (d) adhesive material attaching the shank portions to the first surface of the dielectric material at least part of the first and second flex portions being spaced from the dielectric material by approximately the thickness of the adhesive material.

19. The probe assembly of claim 18 wherein a first edge of the ground plane conductor is coextensive with one of the first and second edges of the first dielectric material.

20. The probe assembly of claim 18 wherein a first edge portion of the ground plane conductor extends beyond the first edge of the first dielectric material.

21. The probe assembly of claim 18 including a first support having a planar surface supporting the ground plane conductor.

22. The probe assembly of claim 21 including a second support having a planar surface supporting second dielectric material adjacent to the first flex portions to guide the first flex portions during flexing thereof, the second dielectric material being on the opposite side of the first flex portions from the first dielectric material.

23. The probe assembly of claim 22 wherein the second support also includes a planar surface supporting third dielectric material adjacent to the second flex portions to guide the second flex portions during flexing thereof, the third dielectric material being on the opposite side of the second flex portions from the first dielectric material.

24. The probe assembly of claim 23 wherein the first support includes first and second moveable parts supporting opposite end portions of the first dielectric material, a midportion of the first dielectric material and shank portions of the probes flexing to allow relative movement between the first and second moveable parts.

25. The probe assembly of claim 24 wherein the second support includes third and fourth moveable parts connected in fixed relation to the first and second moveable parts, respectively, the third moveable part supporting the second dielectric material, and the fourth moveable part supporting the third dielectric material.

26. The probe assembly of claim 25 wherein the third moveable part is supported by and moveable along a first portion of a guide support and the fourth moveable part is supported by and moveable along a second part of the guide support.

27. The probe assembly of claim 23 wherein the first support supports a portion of the ground conductor coextensive with the first dielectric material, and the first support is supported in fixed relation to the second support.

28. The probe assembly of claim 23 wherein the first and second supports are electrically conductive and are electrically connected to the ground plane conductor.

29. The probe assembly of claim 18 wherein spacings between the contact tips of the second flex portions are much less than spacings between the contact tips of the first flex portions, and the shank portions fan out from the second flex portions to corresponding first flex portions, respectively.

30. The probe assembly of claim 20 wherein the first edge portion is adapted to abut a ground conductor of a printed circuit board as the contact tips of the first flex portions are pressed against corresponding signal conductors, respectively, of the printed circuit board.

31. The probe assembly of claim 30 wherein the first edge of the first dielectric material is coextensive with an edge of a support supporting the ground plane conductor, and the first edge portion is pressed against the edge of the support to minimize or eliminate any air gaps between the first edge of the first dielectric material and the ground conductor of the printed circuit board to provide essentially constant characteristic impedance along the signal paths between the probes and the signal conductors of the printed circuit board.

32. The probe assembly of claim 31 wherein a second edge portion of the ground plane conductor is coextensive with the second edge of the first dielectric material so the ground plane conductor does not contact an integrated circuit wafer as bonding pads thereof are pressed against the contact tips of the second flex portions, respectively.

33. A probe module comprising first and second probe assemblies, each probe assembly including:

(a) a plurality of probes each having a shank portion, curved first and second flex portions on first and second ends of the shank portion, respectively, and a contact tip on an end of the first and second flex portions, respectively;

(b) thin first dielectric material of uniform thickness, each shank portion being attached to a first surface of the first dielectric material, each first flex portion and second flex portion being adjacent to and moveable relative to the first surface;

(c) a ground plane conductor on a second surface of the first dielectric material, part of each of the first and second flex portions extending beyond first and second edges, respectively, of the first dielectric material, the ground plane conductor and the dielectric material extending beyond the shank portion of each probe and along of the flex portion of each probe, the first dielectric material being smooth to allow guiding of the first and second flex portions during flexing thereof, wherein the ground plane conductor and the first dielectric material provide controlled, substantially uniform characteristic impedance along the entire length of each probe;

(d) adhesive material attaching the shank portions to the first surface of the dielectric material, part of the first and second flex portions being spaced from the dielectric material by approximately the thickness of the adhesive material;

(e) a first support having a planar surface supporting the ground plane conductors of the first and second probe assemblies;

(f) a second support having a planar surface supporting second dielectric material adjacent to the first flex portions of the first probe assembly to guide the first flex portions of the first probe assembly during flexing thereof, the second dielectric material being on the opposite side of the first flex portions of the first probe assembly from the first dielectric material of the first probe assembly; and (g) a third support having a planar surface supporting third dielectric material adjacent to the first flex portions of the second probe assembly to guide the first flex portions of the second probe assembly during flexing thereof, the third dielectric material being on the opposite side of the first flex portions of the second probe assembly from the first dielectric material of the second probe assembly.

34. The probe module of claim 33 wherein the second support of the first probe assembly also includes a planar surface supporting fourth dielectric material adjacent to the second flex portions of the first probe assembly to guide the second flex portions of the first probe assembly during flexing thereof, the fourth dielectric material being on the opposite side of the second flex portions of the first probe assembly from the first dielectric material, and wherein the second support of the second probe assembly also includes a planar surface supporting fifth dielectric material adjacent to the second flex portions of the second probe assembly to guide the second flex portions of the second probe assembly during flexing thereof, the fifth dielectric material being on the opposite side of the second flex portions of the second probe assembly from the first dielectric material.

35. The probe module of claim 33 wherein in each of the first and second probe assemblies a first edge portion of the ground plane conductor extends beyond the first edge of the first dielectric material.

36. The probe module of claim 35 wherein in each of the first and second probe assemblies the first support supports a portion of the ground conductor coextensive with the first dielectric material, and the first support is supported in fixed relation to the second support.

37. The probe module of claim 36 wherein the first, second, and third supports are electrically conductive and are electrically connected to the ground plane conductor.

38. The probe module of claim 33 wherein in each of the first and second probe assemblies a first edge portion of the ground plane conductor extends beyond the first edge of the first dielectric material, and wherein the first edge portion is adapted to abut a ground conductor of a printed circuit board as the contact tips of the first flex portions are pressed against corresponding signal conductors, respectively, of the printed circuit board.

39. The probe module of claim 38 wherein in each of the first and second probe assemblies the first edge of the first dielectric material is coextensive with an edge of a support supporting the ground plane conductor, and the first edge portion is pressed against the edge of the support to minimize or eliminate any air gaps between the first edge of the first dielectric material and the ground conductor of the printed circuit board to provide essentially constant characteristic impedance along the signal paths between the probes and the signal conductors of the printed circuit board.

40. The probe module of claim 39 wherein in each of the first and second probe assemblies a second edge portion of the ground plane conductor is coextensive with the second edge of the first dielectric material so the ground plane conductor does not contact an integrated circuit wafer as bonding pads thereof are pressed against the contact tips of the second flex portions, respectively.

* * * * *